US012696591B2

(12) United States Patent
Hsu et al.

(10) Patent No.: US 12,696,591 B2
(45) Date of Patent: Jul. 28, 2026

(54) DISPLAY DEVICE HAVING DIFFERENT OPENING WIDTHS OR OPENINGS WITH OPPOSITE OFFSET SHIFT OF STACKED LIGHT-SHIELDING LAYERS IN DIFFERENT LED COLORS

(71) Applicant: AUO Corporation, Hsinchu (TW)

(72) Inventors: Jia Hao Hsu, Hsinchu (TW);
Kun-Cheng Tien, Hsinchu (TW);
Ming-Lung Chen, Hsinchu (TW)

(73) Assignee: AUO Corporation, Hsinchu (TW)

( * ) Notice: Subject to any disclaimer, the term of this patent is extended or adjusted under 35 U.S.C. 154(b) by 375 days.

(21) Appl. No.: 18/396,705

(22) Filed: Dec. 27, 2023

(65) Prior Publication Data

US 2025/0204098 A1     Jun. 19, 2025

(30) Foreign Application Priority Data

Dec. 14, 2023    (TW) ................................. 112148810

(51) Int. Cl.
*H10H 29/37*          (2025.01)
*H10D 86/40*          (2025.01)
(Continued)

(52) U.S. Cl.
CPC .......... *H10H 20/84* (2025.01); *H10D 86/441* (2025.01); *H10D 86/60* (2025.01); *H10H 29/142* (2025.01); *H10W 90/00* (2026.01)

(58) Field of Classification Search
CPC ...... H10H 20/84; H10H 29/142; H10H 29/37; H10H 29/345; H10H 29/8552;
(Continued)

(56) References Cited

U.S. PATENT DOCUMENTS 10,417,477 B2 *  9/2019  Ko et al. .............. G06K 9/0004
11,092,828 B2 *  8/2021  Li et al. ................ G02F 1/1323
(Continued)

FOREIGN PATENT DOCUMENTS

CN        109461744        3/2019
CN        110333620 A  * 10/2019  ....... G02F 1/133512
(Continued)

*Primary Examiner* — Wael M Fahmy
*Assistant Examiner* — Alice W Tang
(74) *Attorney, Agent, or Firm* — JCIPRNET

(57)          ABSTRACT

A display apparatus includes a driving backplane, a plurality of light-emitting elements disposed on the driving backplane, a first light-shielding layer disposed on the plurality of light-emitting elements, and a second light-shielding layer disposed on the first light-shielding layer. The plurality of light-emitting elements include a first light-emitting element and a second light-emitting element. The first light-shielding layer has a first opening and a second opening respectively overlapping the first light-emitting element and the second light-emitting element. The second light-shielding layer has a first opening and a second opening respectively overlapping the first light-emitting element and the second light-emitting element. An area of the first opening of the first light-shielding layer and an area of the second opening of the second light-shielding layer are substantially the same. An area of the first opening of the second light-shielding layer is less than the area of the second opening of the second light-shielding layer.

9 Claims, 6 Drawing Sheets

(51) Int. Cl.

| | |
|---|---|
| *H10D 86/60* | (2025.01) |
| *H10H 20/84* | (2025.01) |
| *H10H 29/14* | (2025.01) |
| *H10W 90/00* | (2026.01) |
| *H10H 20/855* | (2025.01) |

(58) Field of Classification Search
    CPC .... H10H 29/855; H10D 86/441; H10D 86/60;
                                                    H10W 90/00
    See application file for complete search history.

(56)                     References Cited

U.S. PATENT DOCUMENTS

| | | | |
|---|---|---|---|
| 2017/0287887 A1 | 10/2017 | Takeya et al. | |
| 2018/0012949 A1 | 1/2018 | Takeya et al. | |
| 2018/0226597 A1 | 8/2018 | Byun et al. | |
| 2021/0328088 A1* | 10/2021 | Chung et al. | H01L 31/125 |
| 2022/0093668 A1* | 3/2022 | Kim et al. | H01L 27/14623 |
| 2022/0399421 A1* | 12/2022 | Hai et al. | H01L 27/3272 |
| 2023/0105947 A1* | 4/2023 | Zhang et al. | G02F 1/133512 |

FOREIGN PATENT DOCUMENTS

| | | | | | |
|---|---|---|---|---|---|
| CN | 111240065 A | * | 6/2020 | | G06V 40/13 |
| CN | 114170919 | | 3/2022 | | |
| WO | WO 2018/153065 A1 | * | 8/2018 | | G06V 40/13 |

* cited by examiner

DISPLAY DEVICE HAVING DIFFERENT OPENING WIDTHS OR OPENINGS WITH OPPOSITE OFFSET SHIFT OF STACKED LIGHT-SHIELDING LAYERS IN DIFFERENT LED COLORS

CROSS-REFERENCE TO RELATED APPLICATION

This application claims the priority benefit of Taiwan application serial no. 112148810, filed on Dec. 14, 2023. The entirety of the above-mentioned patent application is hereby incorporated by reference herein and made a part of this specification.

BACKGROUND

Technical Field

The disclosure relates to an electronic device, and in particular, to a display apparatus.

Description of Related Art

A light-emitting diode display panel includes a driving backplane and a plurality of light-emitting diode elements disposed on the driving backplane. Inheriting the characteristics of a light-emitting diode, the light-emitting diode display panel has the advantages of power saving, high efficiency, high brightness, and fast response time. In addition, compared with an organic light-emitting diode display panel, the light-emitting diode display panel also has the advantages of easy color adjustment, long luminous life, and no image imprinting. Therefore, the light-emitting diode display panel is regarded as the next generation of display technology. However, the light-emitting diode display panel has a serious color shift problem in the large viewing angle direction, and there is also a color shift in the left and right viewing angle directions, which affects the optical performance thereof.

SUMMARY

An embodiment of the disclosure provides a light-emitting diode display panel with favorable optical performance.

Another embodiment of the disclosure provides another light-emitting diode display panel with favorable optical performance.

A display apparatus according to an embodiment of the disclosure includes a driving backplane, a plurality of light-emitting elements, a first light-shielding layer, and a second light-shielding layer. The plurality of light-emitting elements are disposed on the driving backplane and electrically connected to the driving backplane. The plurality of light-emitting elements are located between the first light-shielding layer and the driving backplane. The plurality of light-emitting elements include a first light-emitting element and a second light-emitting element respectively configured to emit a first color light and a second color light that are different. The first light-shielding layer has a first opening and a second opening respectively overlapping the first light-emitting element and the second light-emitting element. The first light-shielding layer is located between the second light-shielding layer and the plurality of light-emitting elements. The second light-shielding layer has a first opening and a second opening respectively overlapping the first light-emitting element and the second light-emitting element. An area of the first opening of the first light-shielding layer and an area of the second opening of the second light-shielding layer are substantially the same. An area of the first opening of the second light-shielding layer is less than the area of the second opening of the second light-shielding layer.

A display apparatus according to another embodiment of the disclosure includes a driving backplane, a plurality of light-emitting elements, a first light-shielding layer, and a second light-shielding layer. The plurality of light-emitting elements are disposed on the driving backplane and electrically connected to the driving backplane. The plurality of light-emitting elements are located between the first light-shielding layer and the driving backplane. The plurality of light-emitting elements include a first light-emitting element and a second light-emitting element respectively configured to emit a first color light and a second color light that are different. The first light-shielding layer has a first opening and a second opening respectively overlapping the first light-emitting element and the second light-emitting element. The first light-shielding layer is located between the second light-shielding layer and the plurality of light-emitting elements. The second light-shielding layer has a first opening and a second opening respectively overlapping the first light-emitting element and the second light-emitting element. A geometric center of the first opening of the second light-shielding layer is offset in a first offset direction relative to a geometric center of the first opening of the first light-shielding layer. A geometric center of the second opening of the second light-shielding layer is offset in a second offset direction relative to a geometric center of the second opening of the first light-shielding layer, and the first offset direction is opposite to the second offset direction.

DESCRIPTION OF THE EMBODIMENTS

Figure 1:
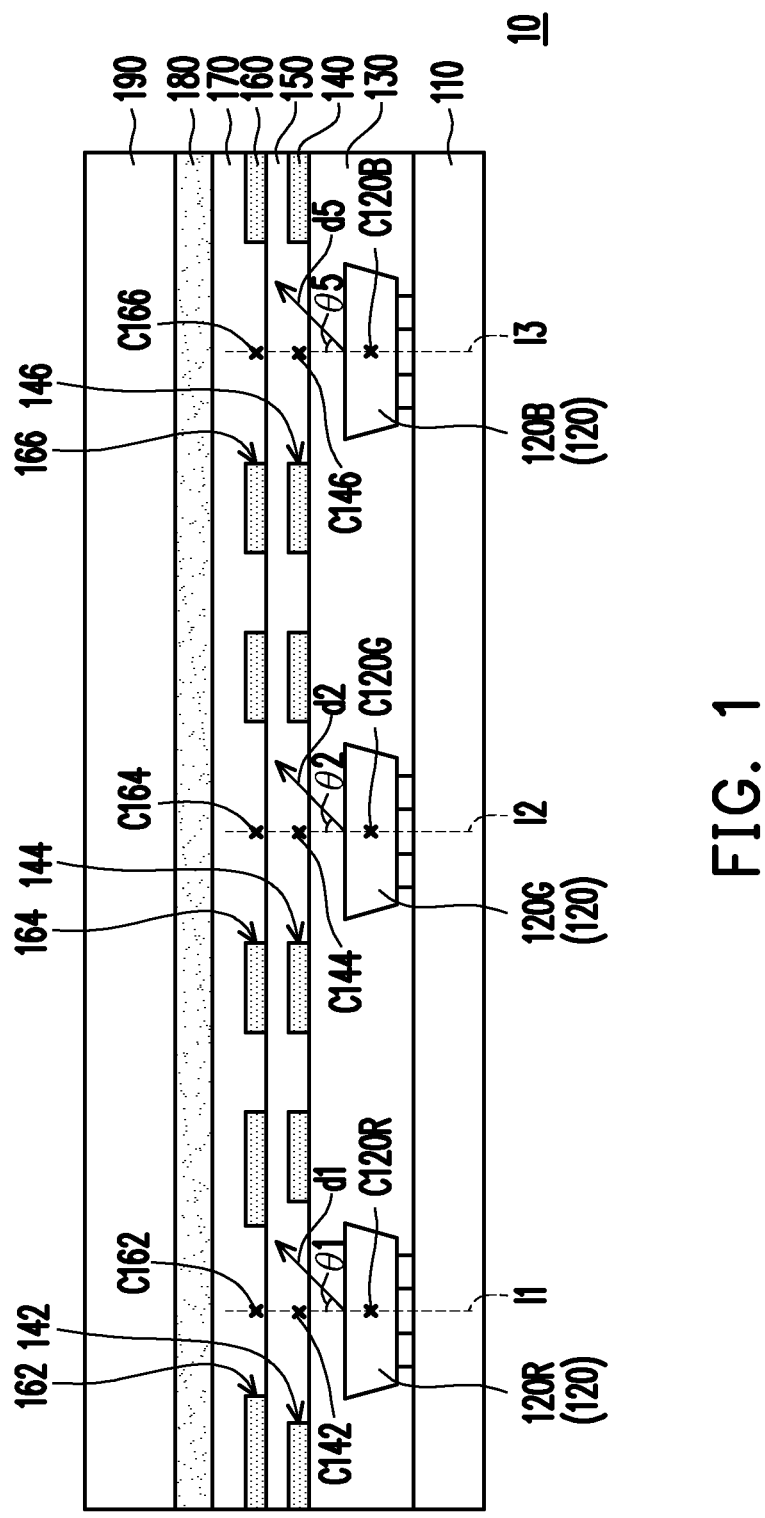
FIG. 1 is a schematic cross-sectional view of a display apparatus according to an embodiment of the disclosure.

Reference will now be made in detail to the present preferred embodiments of the disclosure, examples of which are illustrated in the accompanying drawings. Whenever possible, the same reference numbers are used in the drawings and description to refer to the same or like parts.

It should be understood that when an element such as a layer, film, region, or substrate is referred to as being "on" or "connected to" another element, it may be directly on or connected to another element, or intervening elements may also be present. In contrast, when an element is referred to as being "directly on" or "directly connected to" another element, no intervening elements are present. As used herein, "connected" may refer to physical connection and/or electrical connection. Furthermore, "electrical connection" or "coupling" may mean the presence of other elements between two elements.

The term "about," "approximately," or "substantially" as used herein is inclusive of the stated value and means within an acceptable range of deviation for the particular value as determined by people having ordinary skill in the art, considering the measurement in question and the error associated with measurement of the particular quantity (i.e., the limitations of the measurement system). For example, "about" may mean within one or more standard deviations, for example, within +30%, +20%, +10%, +5% of the stated value. Furthermore, a relatively acceptable range of deviation or standard deviation may be chosen for the terms "about," "approximately," or "substantially" as used herein based on optical properties, etching properties or other properties, instead of applying one standard deviation across all the properties.

Unless otherwise defined, all terms (including technical and scientific terms) used herein have the same meaning as commonly understood by people of ordinary skill in the art. It will be further understood that terms such as those defined in the commonly used dictionaries, should be interpreted as having a meaning that is consistent with their meaning in the context of the relevant art and the invention, and will not be interpreted in an idealized or overly formal sense unless expressly so defined herein.

FIG. 1 is a schematic cross-sectional view of a display apparatus according to an embodiment of the disclosure. Referring to FIG. 1, a display apparatus 10 includes a driving backplane 110. The driving backplane 110 includes a substrate (not shown) and a driving circuit structure (not shown) disposed on the substrate. For example, in an embodiment, the driving circuit structure may include a plurality of horizontal signal lines (not shown), a plurality of vertical signal lines (not shown), and a plurality of pixel driving circuits (not shown) electrically connected to the plurality of horizontal signal lines and the plurality of vertical signal lines. Each pixel driving circuit may have a pad group (not shown), but the disclosure is not limited thereto.

The display apparatus 10 further includes a plurality of light-emitting elements 120 disposed on the driving backplane 110 and electrically connected to the driving backplane 110. Specifically, in an embodiment, each light-emitting element 120 is electrically connected to a corresponding pad group of the pixel driving circuit. For example, in an embodiment, the plurality of light-emitting elements 120 may include a first light-emitting element 120R, a second light-emitting element 120G, and a third light-emitting element 120B. The first light-emitting element 120R, the second light-emitting element 120G, and the third light-emitting element 120B are respectively configured to emit a first color light (not shown), a second color light (not shown), and a third color light (not shown). The first color light, the second color light, and the third color light are different from each other. For example, in an embodiment, the first color light, the second color light, and the third color light may respectively be red light, green light, and blue light, but the disclosure is not limited thereto. In an embodiment, the plurality of light-emitting elements 120 are, for example, a plurality of micro light-emitting diodes (μLEDs), but the disclosure is not limited thereto.

In an embodiment, the display apparatus 10 further includes a first planarization layer 130 disposed on the driving backplane 110 and covering the plurality of light-emitting elements 120. The first planarization layer 130 is light-transmissive. In an embodiment, the material of the first planarization layer 130 may be an inorganic material (such as silicon oxide, silicon nitride, silicon oxynitride, or a stacked layer of at least two of the above materials), an organic material, or a combination thereof.

The display apparatus 10 further includes a first light-shielding layer 140. The plurality of light-emitting elements 120 are located between the first light-shielding layer 140 and the driving backplane 110. Specifically, in an embodiment, the first light-shielding layer 140 is disposed on the first planarization layer 130 and located above the plurality of light-emitting elements 120. In an embodiment, the material of the first light-shielding layer 140 is, for example, blackened metal. However, the disclosure is not limited thereto. In other embodiments, the material of the first light-shielding layer 140 may also be other light-absorbing/ light-blocking materials.

The first light-shielding layer 140 has a first opening 142 and a second opening 144 respectively overlapping the first light-emitting element 120R and the second light-emitting element 120G. The area of the first opening 142 of the first light-shielding layer 140 and the area of the second opening 144 of the first light-shielding layer 140 are substantially the same. In an embodiment, the first light-shielding layer 140 further has a third opening 146 overlapping the third light-emitting element 120B. In an embodiment, the area of the first opening 142 of the first light-shielding layer 140, the area of the second opening 144 of the first light-shielding layer 140, and the area of the third opening 146 of the first light-shielding layer 140 may be substantially the same.

In an embodiment, a geometric center C142 of the first opening 142 of the first light-shielding layer 140 and a geometric center C120R of the first light-emitting element 120R can be substantially aligned, a geometric center C144 of the second opening 144 of the first light-shielding layer 140 and a geometric center C120G of the second light-emitting element 120G can be substantially aligned, and a geometric center C146 of the third opening 146 of the first light-shielding layer 140 and a geometric center C120B of the third light-emitting element 120B can be substantially aligned. However, the disclosure is not limited thereto.

In an embodiment, the display apparatus 10 further includes a second planarization layer 150 covering the first light-shielding layer 140. The second planarization layer 150 is light-transmissive. In an embodiment, the material of the second planarization layer 150 may be an inorganic material (such as silicon oxide, silicon nitride, silicon oxynitride, or a stacked layer of at least two of the above materials), an organic material, or a combination thereof.

The display apparatus 10 further includes a second light-shielding layer 160. The first light-shielding layer 140 is located between the second light-shielding layer 160 and the plurality of light-emitting elements 120. Specifically, in an embodiment, the second light-shielding layer 160 is disposed on the second planarization layer 150 and located above the first light-shielding layer 140. In an embodiment, the material of the second light-shielding layer 160 is, for example, blackened metal. However, the disclosure is not limited thereto. In other embodiments, the material of the second light-shielding layer 160 may also be other light-absorbing/light-blocking materials.

The second light-shielding layer 160 has a first opening 162 and a second opening 164 respectively overlapping the first light-emitting element 120R and the second light-emitting element 120G. The area of the first opening 142 of the first light-shielding layer 140 and the area of the second opening 164 of the second light-shielding layer 160 are substantially the same. The area of the first opening 162 of the second light-shielding layer 160 is less than the area of the second opening 164 of the second light-shielding layer 160. In an embodiment, the area of the first opening 162 of the second light-shielding layer 160 is less than the area of the first opening 142 of the first light-shielding layer 140. In an embodiment, the area of the first opening 162 of the second light-shielding layer 160 falls within the area of the first opening 142 of the first light-shielding layer 140. In an embodiment, the area of the first opening 142 of the first light-shielding layer 140, the area of the second opening 144 of the first light-shielding layer 140, and the area of the second opening 164 of the second light-shielding layer 160 may be substantially the same, but the disclosure is not limited thereto. In an embodiment, the second light-shielding layer 160 further has a third opening 166 overlapping the third light-emitting element 120B. The area of the first opening 162 of the second light-shielding layer 160 is less than the area of the third opening 166 of the second light-shielding layer 160. In an embodiment, the area of the third opening 166 of the second light-shielding layer 160 may optionally be the same as the area of the third opening 146 of the first light-shielding layer 140, but the disclosure is not limited thereto. In an embodiment, the area of the third opening 166 of the second light-shielding layer 160 may optionally be the same as the area of the first opening 142 of the first light-shielding layer 140, but the disclosure is not limited thereto.

In an embodiment, a geometric center C162 of the first opening 162 of the second light-shielding layer 160 and the geometric center C142 of the first opening 142 of the first light-shielding layer 140 can be optionally aligned, a geometric center C164 of the second opening 164 of the second light-shielding layer 160 and the geometric center C144 of the second opening 144 of the first light-shielding layer 140 can be optionally aligned, and a geometric center C166 of the third opening 166 of the second light-shielding layer 160 and the geometric center C146 of the third opening 146 of the first light-shielding layer 140 can be optionally aligned, but the disclosure is not limited thereto.

Figure 2:
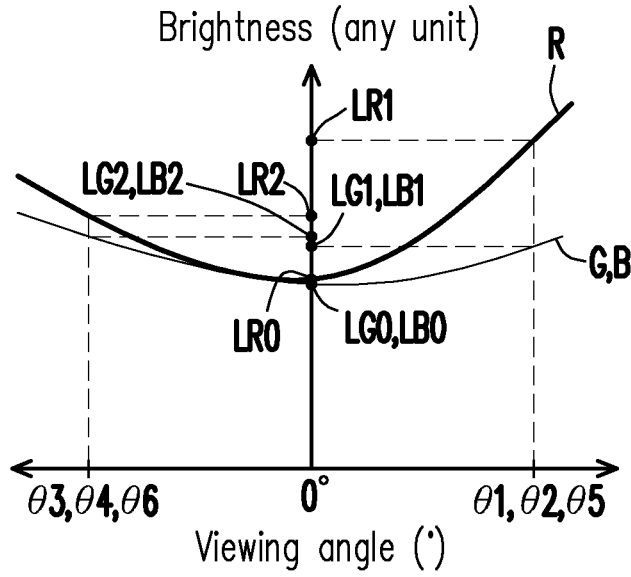
FIG. 2 shows brightness of a first light-emitting element, a second light-emitting element, and a third light-emitting element at each viewing angle according to an embodiment of the disclosure.

FIG. 2 shows brightness of a first light-emitting element, a second light-emitting element, and a third light-emitting element at each viewing angle according to an embodiment of the disclosure. It should be noted that the brightness shown in FIG. 2 refers to the brightness at each viewing angle when the first light-emitting element 120R, the second light-emitting element 120G, and the third light-emitting element 120B of FIG. 1 are not blocked by any shielding object (for example, the first light-shielding layer 140, the second light-shielding layer 160, etc.). A curve R of FIG. 2 represents the brightness of the first light-emitting element 120R of FIG. 1 at each viewing angle. A curve G of FIG. 2 represents the brightness of the second light-emitting element 120G of FIG. 1 at each viewing angle. A curve B of FIG. 2 represents the brightness of the third light-emitting element 120B of FIG. 1 at each viewing angle.

Please refer to FIG. 1 and FIG. 2. Each light-emitting element 120 has a first side (e.g., right side) and a second side (e.g., left side) that are opposing. A first oblique viewing angle direction d1 is located on the first side of the first light-emitting element 120R. A first angle θ1 is included between the first oblique viewing angle direction d1 and a first optical axis I1 of the first light-emitting element 120R. A second oblique viewing angle direction d2 is located on the first side of the second light-emitting element 120G. A second angle θ2 is included between the second oblique viewing angle direction d2 and a second optical axis I2 of the second light-emitting element 120G. A fifth oblique viewing angle direction d5 is located on the first side of the third light-emitting element 120B. A fifth angle θ5 is included between the fifth oblique viewing angle direction d5 and a third optical axis I3 of the third light-emitting element 120B. The first angle θ1, the second angle θ2, and the fifth angle θ5 are substantially the same. A ratio (LR1/LR0) of brightness LR1 of the first light-emitting element 120R in the first oblique viewing angle direction d1 to brightness LR0 of the first light-emitting element 120R on the first optical axis I1 is greater than a ratio (LG1/LG0) of brightness LG1 of the second light-emitting element 120G in the second oblique viewing angle direction d2 to brightness LG0 of the second light-emitting element 120G on the second optical axis I2. The ratio (LR1/LR0) of the brightness LR1 of the first light-emitting element 120R in the first oblique viewing angle direction d1 to the brightness LR0 of the first light-emitting element 120R on the first optical axis I1 is greater than a ratio of (LB1/LB0) of brightness LB1 of the third light-emitting element 120B in a fifth oblique viewing angle direction d5 to brightness LB0 of the third light-emitting element 120B on the third optical axis I3. That is to say, in terms of the optical characteristics of the light-emitting element 120 itself, the brightness of the first light-emitting element 120R in the large viewing angle direction (i.e., the first oblique viewing angle direction d1) is relatively high to a greater extent, while the brightness of the second light-emitting element 120G in the large viewing angle direction (i.e., the second oblique viewing angle direction d2) and the brightness of the third light-emitting element 120B in the large viewing angle direction (i.e., the fifth oblique viewing angle direction d5) is relatively high to a lesser extent. In an embodiment, the first angle θ1, the second angle θ2, and the fifth angle θ5 are, for example, an angle greater than or equal to 35 and less than or equal to 55°, but the disclosure is not limited thereto.

Figure 3:
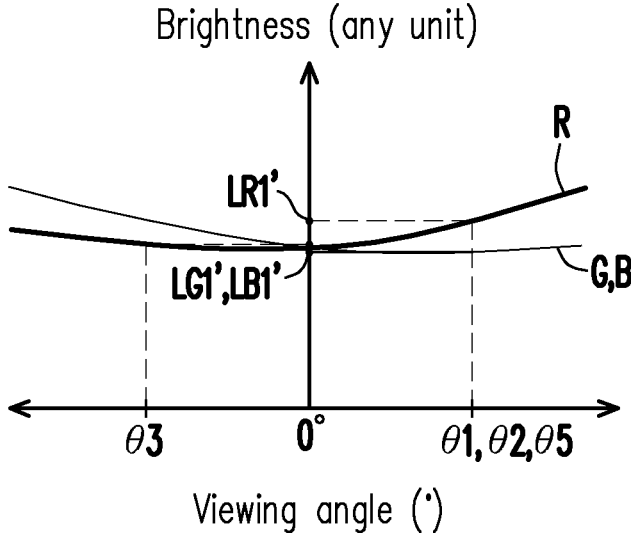
FIG. 3 shows brightness of a display apparatus according to an embodiment of the disclosure at each viewing angle where a first light-emitting element, a second light-emitting element, and a third light-emitting element are located.

FIG. 3 shows brightness of a display apparatus according to an embodiment of the disclosure at each viewing angle where a first light-emitting element, a second light-emitting element, and a third light-emitting element are located. It should be noted that the brightness in FIG. 3 refers to the brightness at each viewing angle when the first light-shielding layer 140 and the second light-shielding layer 160 are disposed above the first light-emitting element 120R, the second light-emitting element 120G, and the third light-emitting element 120B. A curve R of FIG. 3 represents the brightness of the display apparatus 10 of FIG. 1 at each viewing angle where the first light-emitting element 120R is located. A curve G of FIG. 3 represents the brightness of the display apparatus 10 of FIG. 1 at each viewing angle where the second light-emitting element 120G is located. A curve B of FIG. 3 represents the brightness of the display apparatus 10 of FIG. 1 at each viewing angle where the third light-emitting element 120B is located.

Please refer to FIG. 1, FIG. 2, and FIG. 3. Although, in terms of the optical characteristics of the light-emitting element 120 itself, the brightness of the first light-emitting element 120R in the large viewing angle direction is relatively high to a greater extent, while the brightness of the second light-emitting element 120G in the large viewing angle direction and the brightness of the third light-emitting element 120B in the large viewing angle direction is relatively high to a lesser extent, but the area of the first opening 162 of the second light-shielding layer 160 corresponding to the first light-emitting element 120R is small, and the second light-shielding layer 160 can block part of the light beam emitted by the first light-emitting element 120R in the large viewing angle direction (for example, the first oblique viewing angle direction d1). Therefore, brightness LR1' of the display apparatus 10 in the large viewing angle direction (for example, the first oblique viewing angle direction d1) where the first light-emitting element 120R is located will be suppressed, so that the brightness LR1' of the display apparatus 10 in the large viewing angle direction where the first light-emitting element 120R is located, brightness LG1' of the display apparatus 10 in the large viewing angle direction (for example: the second oblique viewing angle direction d2) where the second light-emitting element 120G is located, and brightness LB1' of the display apparatus 10 in the large viewing angle direction (for example, the fifth oblique viewing angle direction d5) where the third light-emitting element 120B is located will be relatively close. That is to say, by adjusting the area sizes of the first opening 162, the second opening 164, and the third opening 166 of the second light-shielding layer 160, the viewing angle characteristics of the display apparatus 10 where the first light-emitting element 120R is located, the viewing angle characteristics of the display apparatus 10 where the second light-emitting element 120G is located, and the viewing angle characteristics of the display apparatus 10 where the third light-emitting element 120B is located can be relatively consistent, which helps to improve the color shift problem in the large viewing angle direction on one side of the display apparatus 10.

Referring to FIG. 1, in an embodiment, the display apparatus 10 further includes a molding substrate 190 disposed on the second light-shielding layer 160. In an embodiment, the material of the molding substrate 190 is, for example, glass, quartz, or other applicable materials. In an embodiment, the display apparatus 10 further includes an optical clear adhesion 180 disposed between the molding substrate 190 and the second light-shielding layer 160. In an embodiment, the display apparatus 10 further includes a molding layer 170. The molding layer 170 covers the second light-shielding layer 160, and the molding substrate 190 is fixed to the molding layer 170 through the optical clear adhesion 180.

It must be noted here that the reference numerals and a part of the contents in the previous embodiment are applicable to the following embodiments, in which identical reference numerals indicate identical or similar components, and repeated descriptions of the same technical contents are omitted. For the detailed descriptions of the omitted parts, reference can be found in the previous embodiment, and no repeated description is contained in the following embodiments.

Figure 4:
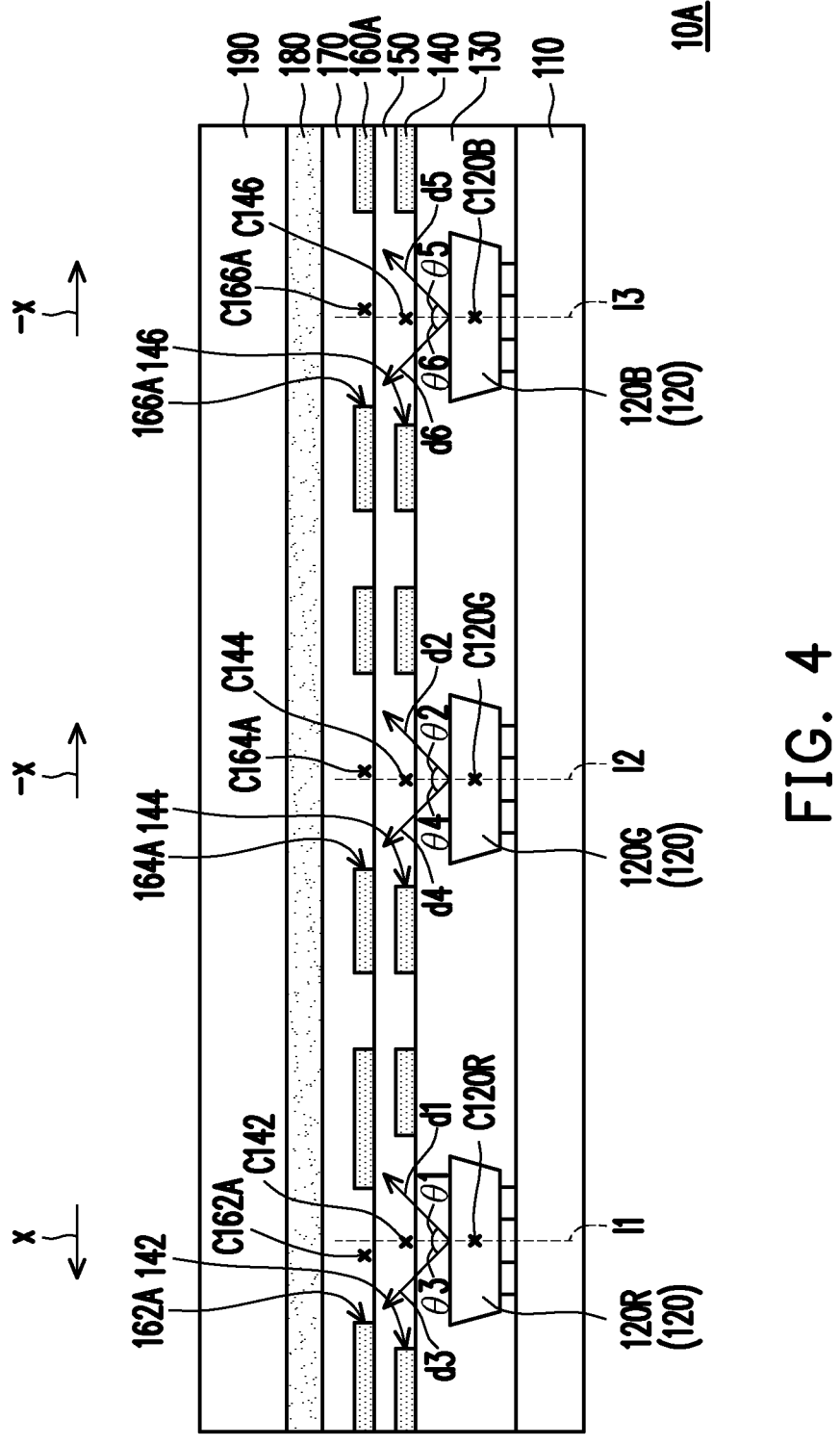
FIG. 4 is a schematic cross-sectional view of a display apparatus according to another embodiment of the disclosure.

FIG. 4 is a schematic cross-sectional view of a display apparatus according to another embodiment of the disclosure. A display apparatus 10A of FIG. 4 is similar to the aforementioned display apparatus 10. The difference between the two is that a second light-shielding layer 160A of the display apparatus 10A of the embodiment is different from the second light-shielding layer 160 of the display apparatus 10 of the aforementioned embodiment.

Please refer to FIG. 4. In the embodiment, the area of a second opening 164A of the second light-shielding layer 160A is less than the area of the second opening 144 of the first light-shielding layer 140, and the area of the second opening 164A of the second light-shielding layer 160A falls within the area of the second opening 144 of the first light-shielding layer 140. In the embodiment, the area of the second opening 164A of the second light-shielding layer 160A is larger than the area of a first opening 162A of the second light-shielding layer 160A and less than the area of the first opening 142 of the first light-shielding layer 140.

In the embodiment, the area of a third opening 166A of the second light-shielding layer 160A is less than the area of the third opening 146 of the first light-shielding layer 140, and the area of the third opening 166A of the second light-shielding layer 160A falls within the area of the third opening 146 of the first light-shielding layer 140. In the embodiment, the area of the third opening 166A of the second light-shielding layer 160A is larger than the area of the first opening 162A of the second light-shielding layer 160A and less than the area of the first opening 142 of the first light-shielding layer 140.

In the embodiment, a first offset direction x is substantially parallel to the driving backplane 110. A geometric center C162A of the first opening 162A of the second light-shielding layer 160A is offset in the first offset direction x relative to the geometric center C142 of the first opening 142 of the first light-shielding layer 140. In the embodiment, a second offset direction −x is substantially parallel to the driving backplane 110. A geometric center C164A of the second opening 164A of the second light-shielding layer 160A is offset in the second offset direction −x relative to the geometric center C144 of the second opening 144 of the first light-shielding layer 140, and the first offset direction x is opposite to the second offset direction −x. In the embodiment, a geometric center C166A of the third opening 166A of the second light-shielding layer 160A is offset in the second offset direction −x relative to the geometric center C146 of the third opening 146 of the first light-shielding layer 140. In short, in the embodiment, the geometric center C162A of the first opening 162A of the second light-shielding layer 160A is offset to the left relative to the geometric center C142 of the first opening 142 of the first light-shielding layer 140. The geometric center C164A of the second opening 164A of the second light-shielding layer 160A is offset to the right relative to the geometric center C144 of the second opening 144 of the first light-shielding layer 140. The geometric center C166A of the third opening 166A of the second light-shielding layer 160A is offset to the right relative to the geometric center C146 of the third opening 146 of the first light-shielding layer 140.

Figure 5:
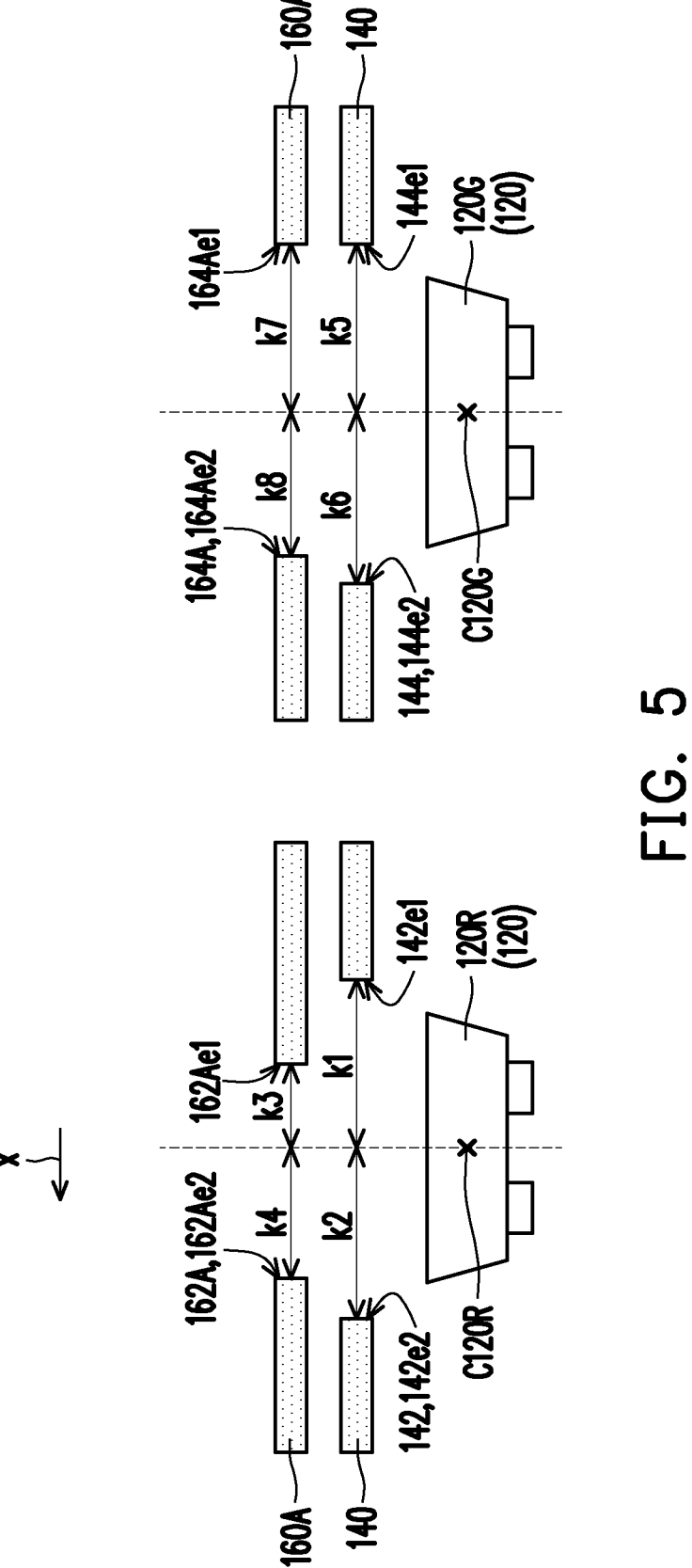
FIG. 5 is a schematic cross-sectional and enlarged view of a first light-emitting element, a second light-emitting element, part of a first light-shielding layer, and part of a second light-shielding layer according to an embodiment of the disclosure.

FIG. 5 is a schematic cross-sectional and enlarged view of a first light-emitting element, a second light-emitting element, part of a first light-shielding layer, and part of a second light-shielding layer according to an embodiment of the disclosure. Referring to FIG. 4 and FIG. 5, the first opening 142 of the first light-shielding layer 140 has a first edge 142e1 and a second edge 142e2 respectively located on the first side (e.g., right side) and the second side (e.g., left side) of the first light-emitting element 120R. The first edge 142e1 has a distance k1 from the geometric center C120R of the first light-emitting element 120R in the first offset direction x parallel to the driving backplane 110. The second edge 142e2 has a distance k2 from the geometric center C120R of the first light-emitting element 120R in the first offset direction x parallel to the driving backplane 110. The first opening 162A of the second light-shielding layer 160A has a first edge 162Ae1 and a second edge 162Ae2 respectively located on the first side and the second side of the first light-emitting element 120R. The first edge 162Ae1 has a distance k3 from the geometric center C120R of the first light-emitting element 120R in the first offset direction x parallel to the driving backplane 110. The second edge 162Ae2 has a distance k4 from the geometric center C120R of the first light-emitting element 120R in the first offset direction x parallel to the driving backplane 110. In an embodiment, (k3+k4)< (k1+k2), k1=k2, and k3<k4. For example, in an embodiment, k1=k2=40 μm, k3-23 μm, and k4=33 μm, but the disclosure is not limited thereto.

Referring to FIG. 4 and FIG. 5, the second opening 144 of the first light-shielding layer 140 has a first edge 144e1 and a second edge 144e2 respectively located on the first side and the second side of the second light-emitting element 120G. The first edge 144e1 has a distance k5 from the geometric center C120G of the second light-emitting element 120G in the first offset direction x parallel to the driving backplane 110. The second edge 144e2 has a distance k6 from the geometric center C120G of the second light-emitting element 120G in the first offset direction x parallel to the driving backplane 110. The second opening 164A of the second light-shielding layer 160A has a first edge 164Ae1 and a second edge 164Ae2 respectively located on the first side and the second side of the second light-emitting element 120G. The first edge 164Ae1 has a distance k7 from the geometric center C120G of the second light-emitting element 120R in the first offset direction x parallel to the driving backplane 110. The second edge 164Ae2 has a distance k8 from the geometric center C120G of the second light-emitting element 120G in the first offset direction x parallel to the driving backplane 110. In an embodiment, (k7+k8)< (k5+k6), k5=k6, and k7>k8. For example, in an embodiment, k5-k6=40 μm, k7=40 μm, k8=33 μm, but the disclosure is not limited thereto.

FIG. 2 also shows the brightness of the first light-emitting element 120R, the second light-emitting element 120G, and the third light-emitting element 120B of FIG. 4 at each viewing angle. It should be noted that the brightness in FIG. 2 refers to the brightness at each viewing angle when there is no shielding object (for example: the first light-shielding layer 140, the second light-shielding layer 160A) above the first light-emitting element 120R, the second light-emitting element 120G, and the third light-emitting element 120B of FIG. 4. The curve R of FIG. 2 can also represent the brightness of the first light-emitting element 120R of FIG. 4 at each viewing angle. The curve G of FIG. 2 can also represent the brightness of the second light-emitting element 120G of FIG. 4 at each viewing angle. The curve B of FIG. 2 can also represent the brightness of the third light-emitting element 120B of FIG. 4 at each viewing angle.

Figure 6:
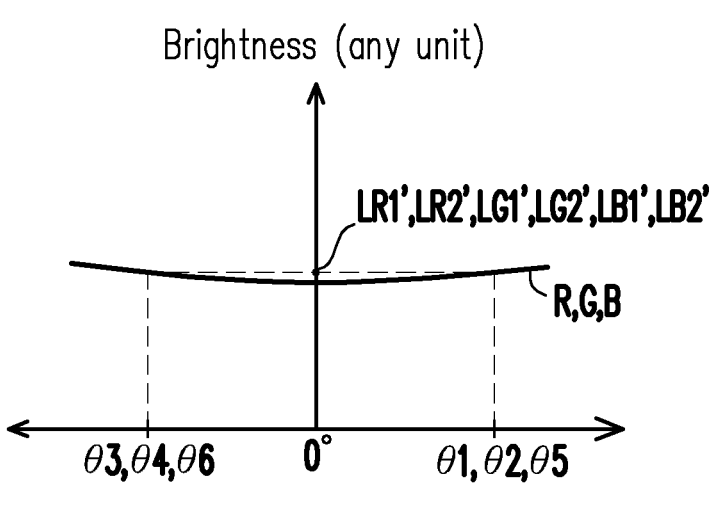
FIG. 6 shows brightness of a display apparatus according to another embodiment of the disclosure at each viewing angle where a first light-emitting element, a second light-emitting element, and a third light-emitting element are located.

FIG. 6 shows brightness of a display apparatus according to another embodiment of the disclosure at each viewing angle where a first light-emitting element, a second light-emitting element, and a third light-emitting element are located. It should be noted that the brightness in FIG. 6 refers to the brightness at each viewing angle when the first light-shielding layer 140 and the second light-shielding layer 160A are disposed above the first light-emitting element 120R, the second light-emitting element 120G, and the third light-emitting element 120B of FIG. 4.

Please refer to FIG. 2 and FIG. 4. Each light-emitting element 120 has a first side (e.g., right side) and a second side (e.g., left side) that are opposing. The first oblique viewing angle direction d1 is located on the first side of the first light-emitting element 120R. The third oblique viewing angle direction d3 is located on the second side of the first light-emitting element 120R. The first angle θ1 is included between the first oblique viewing angle direction d1 and the first optical axis I1 of the first light-emitting element 120R. A third angle θ3 is included between the third oblique viewing angle direction d3 and the first optical axis I1 of the first light-emitting element 120R. The first angle θ1 and the third angle θ3 are substantially the same. In terms of the optical characteristics of the light-emitting element 120 itself, the brightness LR1 of the first light-emitting element 120R in the first oblique viewing angle direction d1 is greater than brightness LR2 of the first light-emitting element 120R in the third oblique viewing angle direction d3. That is to say, the brightness distribution of the first light-emitting element 120R is asymmetric, and the brightness distribution of the first light-emitting element 120R is offset toward the first side (e.g., the right side).

In the embodiment, the geometric center C162A of the first opening 162A of the second light-shielding layer 160A is offset in the first offset direction x relative to the geometric center C142 of the first opening 142 of the first light-shielding layer 140, and the first offset direction x points from the first side (e.g., the right side) of the first light-emitting element 120R to the second side (e.g., the left side) of the first light-emitting element 120R. That is to say, the first opening 162A of the second light-shielding layer 160A is biased toward the second side of the first light-emitting element 120R. Please refer to FIG. 2, FIG. 4, and FIG. 6. Accordingly, the first side of the first light-emitting element 120R with a large brightness distribution will have a higher proportion blocked by the second light-shielding layer 160A, thereby reducing the difference in brightness LR1' and brightness LR2' of the first light-emitting element 120R of the display apparatus 10A in the symmetrical first oblique viewing angle direction d1 and the third oblique viewing angle direction d3. In short, according to the light-emitting characteristics of the first light-emitting element 120R, by offsetting the first opening 162A of the second light-shielding layer 160A in an appropriate direction (e.g., to the left), it can improve the problem of asymmetry in the left and right viewing angles of the display apparatus 10A where the first light-emitting element 120R is located, thereby improving the color shift problem in the large viewing angle on the left and right sides of the display apparatus 10A.

Please refer to FIG. 2 and FIG. 4. Each light-emitting element 120 has a first side (e.g., right side) and a second side (e.g., left side) that are opposing. The second oblique viewing angle direction d2 is located on the first side of the second light-emitting element 120G. The fourth oblique viewing angle direction d4 is located on the second side of the second light-emitting element 120G. The second angle θ2 is included between the second oblique viewing angle direction d2 and the second optical axis I2 of the second light-emitting element 120G. A fourth angle θ4 is included between the fourth oblique viewing angle direction d4 and the second optical axis I2 of the second light-emitting element 120G. The second angle θ2 and the fourth angle θ4 are substantially the same. Brightness LG2 of the second light-emitting element 120G in the fourth oblique viewing angle direction d4 is greater than brightness LG1 of the second light-emitting element 120G in the second oblique viewing angle direction d2. That is to say, the brightness distribution of the second light-emitting element 120G is biased toward the second side (e.g., the left side).

In the embodiment, the geometric center C164A of the second opening 164A of the second light-shielding layer 160A is offset in the second offset direction –x relative to the geometric center C144 of the second opening 144 of the first light-shielding layer 140, and the second offset direction –x points from the second side (e.g., the left side) of the second light-emitting element 120G to the first side (e.g., the right side) of the second light-emitting element 120G. That is to say, the second opening 164A of the second light-shielding layer 160A is offset toward the first side (e.g., the right side) of the second light-emitting element 120G. Please refer to FIG. 2, FIG. 4, and FIG. 6. Accordingly, the second side of the second light-emitting element 120G with a large brightness distribution will have a higher proportion blocked by the second light-shielding layer 160A, thereby reducing the difference in brightness LG1' and brightness LG2' of the second light-emitting element 120G of the display apparatus 10A in the symmetrical second oblique viewing angle direction d2 and the fourth oblique viewing angle direction d4. In short, according to the light-emitting characteristics of the second light-emitting element 120G itself, by offsetting the second opening 164A of the second light-shielding layer 160A in an appropriate direction (e.g., to the right), it can improve the problem of asymmetry in the left and right viewing angles of the display apparatus 10A where the second light-emitting element 120G is located, thereby improving the color shift problem in the large viewing angle on the left and right sides of the display apparatus 10A.

Please refer to FIG. 2 and FIG. 4. Each light-emitting element 120 has a first side (e.g., right side) and a second side (e.g., left side) that are opposing. The fifth oblique viewing angle direction d5 is located on the first side of the third light-emitting element 120B. The sixth oblique viewing angle direction d6 is located on the second side of the third light-emitting element 120B. The fifth angle θ5 is included between the fifth oblique viewing angle direction d5 and the third optical axis 13 of the third light-emitting element 120B. A sixth angle θ6 is included between the sixth oblique viewing angle direction d6 and the third optical axis 13 of the third light-emitting element 120B. The fifth angle θ5 and the sixth angle θ6 are substantially the same. Brightness LB2 of the third light-emitting element 120B in the sixth oblique viewing angle direction d6 is greater than the brightness LB1 of the third light-emitting element 120B in the fifth oblique viewing angle direction d5. That is to say, the brightness distribution of the third light-emitting element 120B is biased toward the second side (e.g., the left side).

In the embodiment, the geometric center C166A of the third opening 166A of the second light-shielding layer 160A is offset toward the second offset direction –x relative to the geometric center C146 of the third opening 146 of the first light-shielding layer 140, and the second offset direction –x points from the second side (e.g., the left side) of the third light-emitting element 120B to the first side (e.g., the right side) of the third light-emitting element 120B. Please refer to FIG. 2, FIG. 4, and FIG. 6. Accordingly, the second side of the third light-emitting element 120B with a large brightness distribution will have a higher proportion blocked by the second light-shielding layer 160A, thereby reducing the difference in brightness LB1' and brightness LB2' of the third light-emitting element 120B of the display apparatus 10A in the symmetrical fifth oblique viewing angle direction d5 and the sixth oblique viewing angle direction d6. In short, according to the light-emitting characteristics of the third light-emitting element 120B itself, by offsetting the third opening 166A of the second light-shielding layer 160A in an appropriate direction (e.g., to the right), it can improve the problem of asymmetry in the left and right viewing angles of the display apparatus 10A where the third light-emitting element 120B is located, thereby improving the color shift problem in the large viewing angle on the left and right sides of the display apparatus 10A.

Compared with the aforementioned display apparatus 10, the display apparatus 10A of the embodiment can not only improve the color shift problem in the large viewing angle on one side, but also improve the color shift problem in the large viewing angle on both left and right sides.

Figure 7:
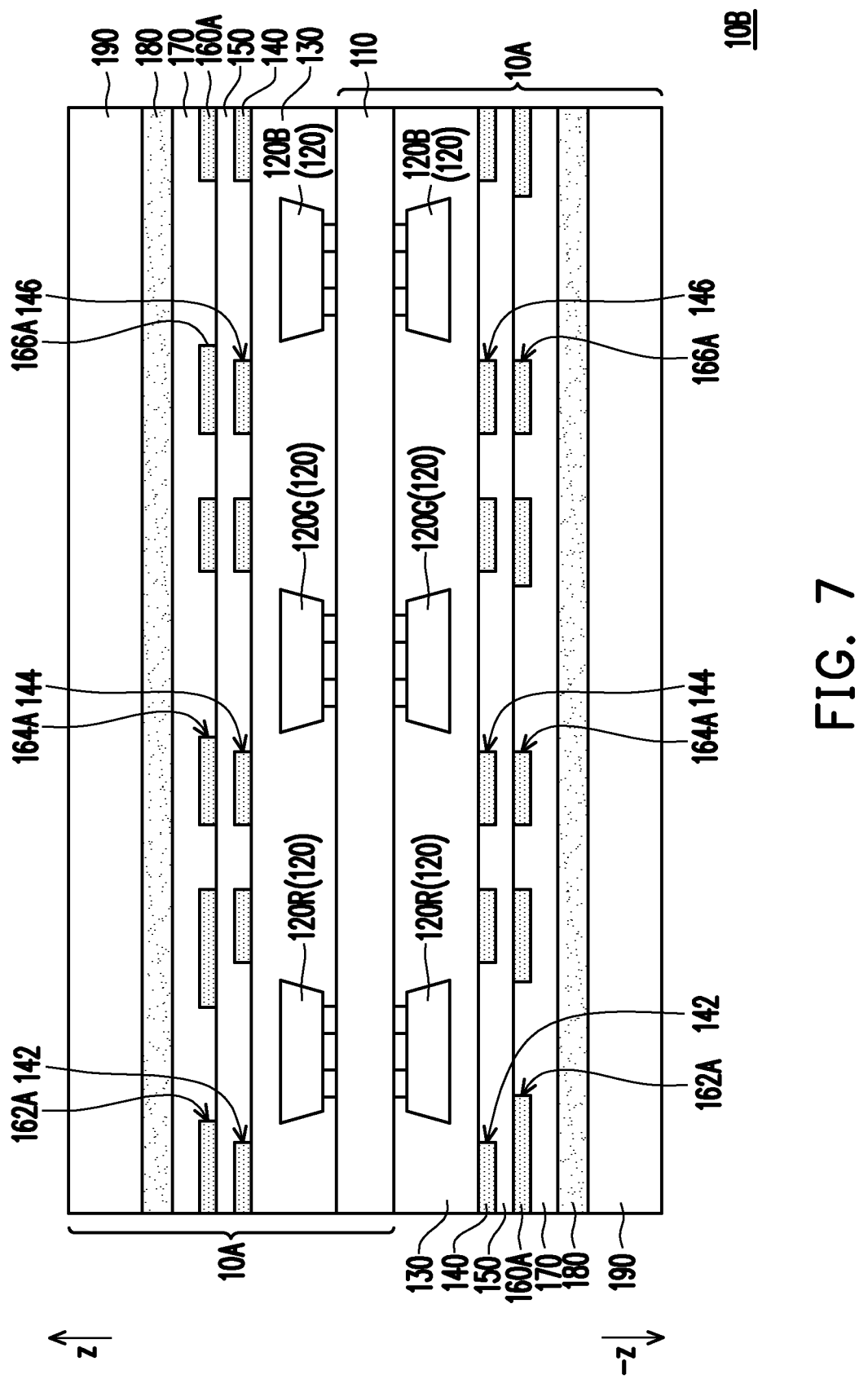
FIG. 7 is a schematic cross-sectional view of a double-sided display apparatus according to an embodiment of the disclosure.

FIG. 7 is a schematic cross-sectional view of a double-sided display apparatus according to an embodiment of the disclosure. A double-sided display apparatus 10B of FIG. 7 may include two display apparatus 10A as shown in FIG. 4. The two display apparatus 10A are respectively configured to emit light in two opposite directions z and –z to achieve a double-sided display effect.

What is claimed is:

1. A display apparatus, comprising:
a driving backplane;
a plurality of light-emitting elements, disposed on the driving backplane, and electrically connected to the driving backplane;
a first light-shielding layer, wherein the light-emitting elements are located between the first light-shielding layer and the driving backplane, the light-emitting elements comprise a first light-emitting element and a second light-emitting element respectively configured to emit a first color light and a second color light that are different, and the first light-shielding layer has a first opening and a second opening respectively overlapping the first light-emitting element and the second light-emitting element; and
a second light-shielding layer, wherein the first light-shielding layer is located between the second light-shielding layer and the light-emitting elements, and the second light-shielding layer has a first opening and a second opening respectively overlapping the first light-emitting element and the second light-emitting element;
wherein an area of the first opening of the first light-shielding layer and an area of the second opening of the second light-shielding layer are substantially the same, and an area of the first opening of the second light-shielding layer is less than the area of the second opening of the second light-shielding layer.

2. A display apparatus according to claim 1, wherein each light-emitting element has a first side and a second side that are opposing, a first oblique viewing angle direction is located on the first side of the first light-emitting element, a first angle is included between the first oblique viewing angle direction and a first optical axis of the first light-emitting element, a second oblique viewing angle direction is located on the first side of the second light-emitting element, a second angle is included between the second oblique viewing angle direction and a second optical axis of the second light-emitting element, the first angle is substantially equal to the second angle, and a ratio of brightness of the first light-emitting element in the first oblique viewing angle direction to brightness of the first light-emitting element on the first optical axis is greater than a ratio of brightness of the second light-emitting element in the second oblique viewing angle direction to brightness of the second light-emitting element on the second optical axis.

3. The display apparatus according to claim 1, wherein the area of the first opening of the second light-shielding layer is less than the area of the first opening of the first light-shielding layer.

4. The display apparatus according to claim 3, wherein the area of the first opening of the second light-shielding layer falls within the area of the first opening of the first light-shielding layer.

5. The display apparatus according to claim 1, wherein the area of the first opening of the first light-shielding layer, an area of the second opening of the first light-shielding layer, and the area of the second opening of the second light-shielding layer are substantially the same.

6. A display apparatus, comprising:

a driving backplane;

a plurality of light-emitting elements, disposed on the driving backplane, and electrically connected to the driving backplane;

a first light-shielding layer, wherein the light-emitting elements are located between the first light-shielding layer and the driving backplane, the light-emitting elements comprise a first light-emitting element and a second light-emitting element respectively configured to emit a first color light and a second color light that are different, and the first light-shielding layer has a first opening and a second opening respectively overlapping the first light-emitting element and the second light-emitting element; and a second light-shielding layer, wherein the first light-shielding layer is located between the second light-shielding layer and the light-emitting elements, and the second light-shielding layer has a first opening and a second opening respectively overlapping the first light-emitting element and the second light-emitting element;

wherein a geometric center of the first opening of the second light-shielding layer is offset in a first offset direction relative to a geometric center of the first opening of the first light-shielding layer, a geometric center of the second opening of the second light-shielding layer is offset in a second offset direction relative to a geometric center of the second opening of the first light-shielding layer, and the first offset direction is opposite to the second offset direction.

7. The display apparatus according to claim 6, wherein each light-emitting element has a first side and a second side that are opposing, a first oblique viewing angle direction is located on the first side of the first light-emitting element, a second oblique viewing angle direction is located on the first side of the second light-emitting element, a third oblique viewing angle direction is located on the second side of the first light-emitting element, a fourth oblique viewing angle direction is located on the second side of the second light-emitting element, a first angle is included between the first oblique viewing angle direction and a first optical axis of the first light-emitting element, a second angle is included between the second oblique viewing angle direction and a second optical axis of the second light-emitting element, a third angle is included between the third oblique viewing angle direction and the first optical axis of the first light-emitting element, a fourth angle is included between the fourth oblique viewing angle direction and the second optical axis of the second light-emitting element, the first angle and the third angle are substantially the same, brightness of the first light-emitting element in the first oblique viewing angle direction is greater than brightness of the first light-emitting element in the third oblique viewing angle direction, and the first offset direction points from the first side of the first light-emitting element to the second side of the first light-emitting element.

8. A display apparatus according to claim 7, wherein the second angle and the fourth angle are substantially the same, brightness of the second light-emitting element in the fourth oblique viewing angle direction is greater than brightness of the second light-emitting element in the second oblique viewing angle direction, and the second offset direction points from the second side of the second light-emitting element to the first side of the second light-emitting element.

9. The display apparatus according to claim 6, wherein an area of the second opening of the second light-shielding layer is greater than an area of the first opening of the second light-shielding layer and less than an area of the first opening of the first light-shielding layer.

* * * * *